(12) United States Patent
Lee et al.

(10) Patent No.: US 11,589,483 B1
(45) Date of Patent: Feb. 21, 2023

(54) THREE-CHAMBERED CONSTANT PRESSURE APPARATUS FOR LIQUID IMMERSION COOLING OF SERVERS

(71) Applicants: Fang-Shou Lee, Taoyuan (TW); Cho-Han Lee, Taoyuan (TW)

(72) Inventors: Fang-Shou Lee, Taoyuan (TW); Cho-Han Lee, Taoyuan (TW); Fang Wang, Livermore, CA (US)

( * ) Notice: Subject to any disclaimer, the term of this patent is extended or adjusted under 35 U.S.C. 154(b) by 0 days.

(21) Appl. No.: 17/402,645

(22) Filed: Aug. 16, 2021

(51) Int. Cl.
*H05K 7/20* (2006.01)

(52) U.S. Cl.
CPC ......... *H05K 7/20818* (2013.01); *H05K 7/203* (2013.01); *H05K 7/20318* (2013.01); *H05K 7/20327* (2013.01)

(58) Field of Classification Search
CPC ............. H05K 7/20818; H05K 7/203; H05K 7/20318; H05K 7/20327; H05K 7/20809; H05K 7/20772; H05K 7/20272; H05K 7/20236; H05K 7/20281; H05K 7/208; H05K 1/0203; H05K 7/20936; F28F 3/12; F28D 15/0266; F28D 2020/0082; G06F 1/20; G06F 2200/201; G06F 1/206
USPC .............. 361/699, 696, 679.53, 700, 679.46; 165/104.33, 104.21, 80.4; 257/714, 712, 257/715; 62/259.2
See application file for complete search history.

(56) References Cited

U.S. PATENT DOCUMENTS

| | | | |
|---|---|---|---|
| 9,844,166 B2 | 12/2017 | Shelnutt et al. | |
| 10,512,192 B2 | 12/2019 | Miyoshi | |
| 2014/0216711 A1* | 8/2014 | Shelnutt | F28D 15/0266 165/104.19 |
| 2018/0084670 A1* | 3/2018 | Hirai | H05K 7/20272 |
| 2019/0014685 A1* | 1/2019 | So | H05K 7/20272 |
| 2021/0410320 A1* | 12/2021 | Yang | H05K 7/20327 |
| 2022/0264761 A1* | 8/2022 | Keehn | H05K 7/203 |

FOREIGN PATENT DOCUMENTS

| | | |
|---|---|---|
| CN | 204272576 U | 4/2015 |
| CN | 107045380 A | 8/2017 |
| CN | 107066056 A | 8/2017 |
| EP | 2665349 B1 | 11/2013 |

* cited by examiner

*Primary Examiner* — Mandeep S Buttar

(57) ABSTRACT

The present invention discloses a three-chambered constant pressure apparatus for liquid immersion cooling of servers. The apparatus comprises a housing within which two partitions are disposed. The two partitions divide the housing into a first chamber, a second chamber and a third chamber. A coolant is maintained within the first chamber, and an isolating liquid is maintained within the second chamber and the third chamber. At least one heat-generating device is submerged within the coolant maintained within the first chamber. During the operation of a server, a coolant is heated to a boiling point temperature generating a coolant vapor that causes the pressure in chambers to rise. By adjusting the air pressure in chambers prior to use, the rising pressure in chambers caused by the coolant vapor can be efficiently relieved. Therefore, the immersion cooling apparatus is maintained at a constant pressure during operation, ensuring the reliability of the immersion cooling apparatus and the sustainability of cooling capacity.

6 Claims, 8 Drawing Sheets

THREE-CHAMBERED CONSTANT PRESSURE APPARATUS FOR LIQUID IMMERSION COOLING OF SERVERS

BACKGROUND OF THE INVENTION

Field of Invention

The present invention relates to an apparatus for liquid immersion cooling of servers. More particularly, this present invention relates to a three-chambered constant pressure apparatus for liquid immersion cooling of servers.

Description of the Related Art

In the past half century, most data centers have used elevated floors for pressurized air passing thereunder to achieve a cooling effect. For example, computer room air conditioning (CRAC) units or computer room air handler (CRAH) units are often used to cool data centers by a constant speed fan supplying cooling air. When small numbers of server cabinets are located in a data center, such types of air cooling systems can still work well in terms of cooling; however, said air cooling systems are clearly not effective and sufficient to meet requirements for heat dissipation in a data center where large numbers of server cabinets are present. In addition, traditional air cooling systems are indirect contact-type cooling ones. Said air cooling systems have such shortcomings as complicated heat transfer process, thermal contact resistance and convective thermal resistance, which cause low heat transfer efficiency and large temperature differences between low and high temperature heat sources during the heat transfer. In addition to the air cooling, a liquid cooling technique has also been applied for the purpose of cooling server cabinets. The liquid cooling technique basically uses working fluid as a heat transfer medium to transfer heat from a heat-generating device to a cooling device. Based on the fact that the specific heat of liquid is higher than that of air, and the heat dissipation rate of liquid is also much larger than that of air, the liquid cooling therefore has higher cooling efficiency than the air cooling.

However, with the advent of the data age, people are increasingly pursuing the pinnacle of science and technology, and the ultimate in efficiency. The conventional cooling techniques such as air cooling and liquid cooling have been unable to meet the excess demand for the cooling of servers. In response to this demand, a phase-change liquid immersion cooling system has been developed in recent years. The liquid immersion cooling system uses a non-conductive coolant to absorb a heat load of a server, and then transforms it to a coolant vapor, which is sequentially condensed to a liquid phase by a condensing device. In terms of thermal principles, an evaporative cooling is a process in which a heat load is removed by the latent heat of vaporization occurring when a non-conductive coolant absorbs heat and then evaporates. Since the latent heat of vaporized liquid is much larger than the specific heat of liquid, the evaporative cooling has a more significant effect on the cooling than the liquid cooling.

Nowadays, as far as the phase-change liquid immersion cooling technology is concerned, a condensing device is usually positioned above the surface of a coolant in order to condense the vapor phase of the coolant to the liquid phase, which can be returned to a coolant-containing tank. However, subject to the cooling capacity of the condensing device and the increase in a heat load emitted by a heat-generating device, the condensing device is incapable of condensing all the entire vapor phase of the coolant due to insufficient cooling capacity. Since a portion of the coolant vapor escapes from the condensing device due to the incomplete condensing, the loss of the coolant is unavoidably incurred.

Moreover, the system pressure plays a very important role in the efficient and timely condensing of a phase-change liquid immersion cooling system. In other words, the boiling point temperature of a coolant is closely related to the system pressure in a phase-change liquid immersion cooling system. When the system pressure gets higher, the boiling point temperature of the coolant turns to be higher as well. As a result, once a condensing device doesn't have sufficient cooling capacity, the vapor phase of the coolant cannot be condensed completely enough to prevent the system pressure from getting higher, which causes the boiling point temperature of the coolant to rise and the failure to meet the requirement for the timely cooling of a server. When the server starts to operate, the coolant is heated to a boiling point temperature generating the coolant vapor and then the pressure in the phase-change liquid immersion cooling system rises accordingly, which leads to the internal temperature of the liquid cooling system to rise.

For the time being, the common solution to the aforementioned problem is that a pressure relief valve is mounted on the housing of the liquid cooling system. When the system pressure reaches a preset threshold, the pressure relief valve relieves the pressure. However, in most cases where a joint or a valve is used as a means to relieve the pressure, there is frictional resistance between the housing of the liquid cooling system and the connecting components such as valves. In the event that the pressure in the liquid cooling system is not high enough to overcome frictional resistance of the connecting components, the coolant vapor cannot be evacuated to the ambient environment in time. Even when the rate of production of the coolant vapor is higher than that of evacuation, the internal pressure in the liquid cooling system will rise, which eventually causes serious unintended consequences for servers. In view of this, in an attempt to ensure the reliability of the liquid immersion cooling system and the sustainability of cooling capacity thereof, it is necessary to develop a novel liquid immersion cooling system which is well maintained at a constant pressure during operation.

BRIEF SUMMARY OF THE INVENTION

The object of the present invention is to provide a three-chambered constant pressure apparatus for liquid immersion cooling of servers. During the operation of a server, a coolant is heated to a boiling point temperature generating a coolant vapor that causes the pressure in chambers to rise. By adjusting the air pressure in chambers prior to use, the rising pressure in chambers caused by the coolant vapor can be efficiently relieved. Therefore, the immersion cooling apparatus is maintained at a constant pressure during operation, ensuring the reliability of the immersion cooling apparatus and the sustainability of cooling capacity thereof.

In order to attain the aforesaid object, according to one embodiment, a three-chambered constant pressure apparatus for liquid immersion cooling of servers comprises a housing having three chambers, a coolant maintained within one of the three chambers, a isolating liquid maintained within two of the three chambers, at least one heat-generating device, and at least one condensing device.

Two partitions are disposed within the housing. The height of each of the partition is smaller than that of the housing. The two partitions divide the housing into a first chamber, a second chamber and a third chamber. The first chamber communicates with the second chamber in an interior top area of the housing, and the second chamber communicates with the third chamber in an interior bottom area of the housing. A coolant is maintained within the first chamber, and an isolating liquid is maintained within the second chamber and the third chamber. A conduit connected to an air pump is mounted on the top of the second chamber, and a valve is mounted on the top of the third chamber. At least one heat-generating device is submerged within the coolant maintained within the first chamber, and at least one condensing device is disposed on an inner side wall of the first chamber.

In one or more embodiments, wherein the heat-generating device is a server.

In one or more embodiments, wherein the condensing device is a condenser coil.

In one or more embodiments, wherein the coolant is a non-conductive coolant.

In one or more embodiments, wherein the coolant has a boiling point temperature ranging from 30° C. to 60° C.

In one or more embodiments, wherein the isolating liquid is glycerol.

As mentioned above, the present invention discloses a novel immersion cooling apparatus, characterized in that a unique three-chambered structure is provided for the apparatus and the air pressure in each of the three chambers is allowed to be adjusted in advance. In other words, prior to a server operates, a portion of the air in the chamber where the server is located is evacuated by an air pump rendering the air pressure in the chamber less than external atmospheric pressure. When the server starts to operate, the temperature of the server rises due to heat generated by server components and then a coolant is heated to a boiling point temperature undergoing a phase change to be vaporized into a coolant vapor for cooling the server, which can be condensed upon contact with or exposure to a condensing device. In the event that the condensing device doesn't have adequate cooling capacity sufficient to condense all the coolant vapor, the air pressure in the chamber will gradually rise. However, the rising air pressure caused by the uncondensed coolant vapor can be relieved under the condition that the air pressure in the chamber has been previously adjusted to less than external atmospheric pressure, which ensures the reliability of the immersion cooling apparatus and the sustainability of cooling capacity thereof.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

Figure 1:
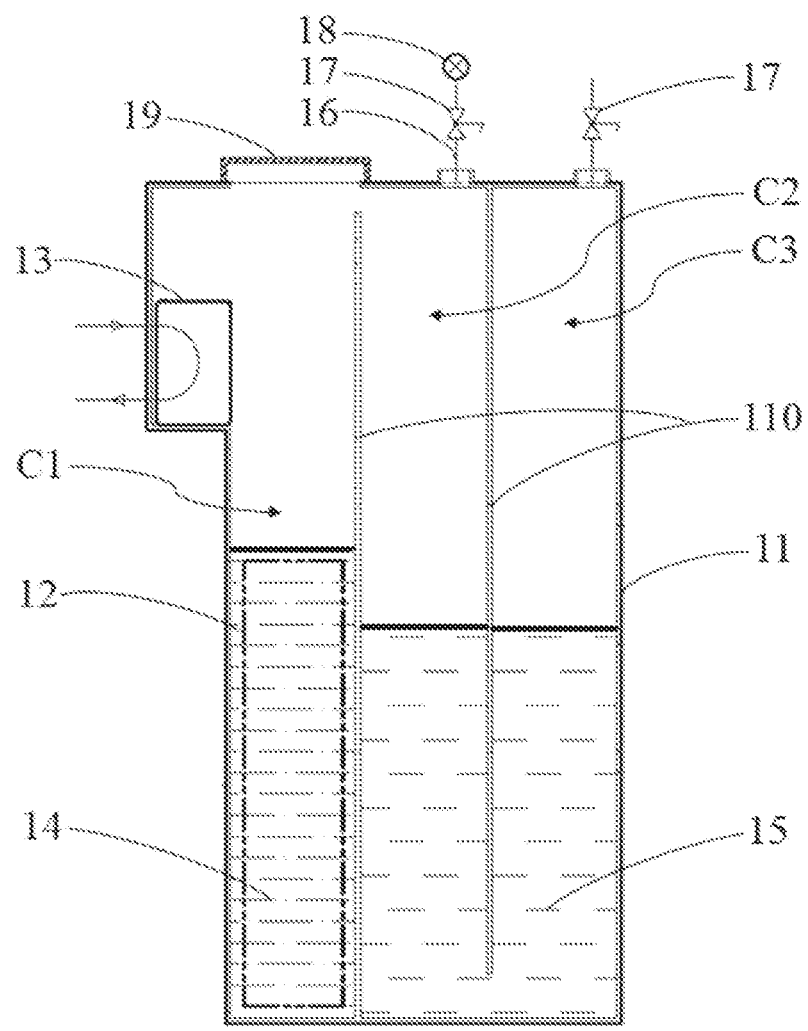
FIG. 1 is a schematic diagram of an example of a three-chambered constant pressure apparatus for liquid immersion cooling of servers, according to one or more embodiments.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others.

Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 1 and 3). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components within immersion cooling apparatus (FIG. 1) and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

The object of the present invention is to provide a three-chambered constant pressure apparatus for liquid immersion cooling of servers. The immersion cooling apparatus has a unique three-chambered structure, which enables the air pressure in the chamber where a server is placed to be pre-adjusted to less than external atmospheric pressure. When the server starts to operate and then generates heat, a coolant facilitates cooling of the server by absorbing the dissipating heat from the server submerged in the coolant. The coolant is heated to a boiling point temperature generating the coolant vapor, which can be condensed back to a liquid phase upon contact with or exposure to a condensing device. The condensed coolant falls back into the chamber due to relative density and operation of gravity. However, in most cases, when one or more servers continue operating for a long time, a great amount of the coolant is vaporized into the coolant vapor by absorbing the dissipating heat from one or more servers submerged in the coolant. One or more condensing devices are not able to completely condense all the coolant vapor into a liquid phase of the coolant due to insufficient cooling capacity. The uncondensed coolant vapor will cause the pressure in the chamber to gradually rise. The rising pressure can be relieved under the condition that the air pressure of the chamber has been previously adjusted to less than external atmospheric pressure.

Example 1

Turning now to the figures, FIG. 1 illustrates a schematic diagram of an example three-chambered constant pressure apparatus for liquid immersion cooling of servers. According to one embodiment, provided is a three-chambered constant pressure immersion cooling apparatus, which comprises a housing 11 that has three separate chambers C1, C2, C3, a coolant 14 maintained within chamber(s), a isolating liquid 15 maintained within chamber(s), at least one heat-generating device 12, and at least one condensing device 13.

The housing 11 is provided with two partitions 110. The height of each of the partitions 110 is smaller than that of the housing 11. The two partitions 110 divide the housing 11 into a first chamber C1, a second chamber C2 and a third chamber C3. The first chamber C1 communicates with the second chamber C2 in an interior top area of the housing 11, and the second chamber C2 communicates with the third chamber C3 in an interior bottom area of the housing 11. A coolant 14 is maintained within the first chamber C1, and an isolating liquid 15 is maintained within the second chamber C2 and the third chamber C3. A top lid 19 is mounted on the top of the first chamber C1. A conduit 16 connected to an air pump 18 is mounted on the top of the second chamber C2. The conduit 16 is further provided with a valve 17, which controls flow of air in and out of the second chamber C2 through the conduit 16. A valve 17 is mounted on the top of the third chamber C3.

In addition to the coolant 14 maintained within the first chamber C1, at least one heat-generating device 12 and at least one condensing device 13 are also disposed in the first chamber C1. The at least one heat-generating device 12 is submerged within the coolant 14. The at least one condensing device 13 is located on the inner side wall of the first chamber C1. Specifically, according to this embodiment, the heat-generating device 12 is completely immersed within the coolant 14; that is, the heat-generating device 12 always remains completely immersed within the coolant 14 during the process in which the coolant 14 is vaporized into a coolant vapor by absorbing heat generated by the heat-generating device 12 and the coolant vapor is condensed back into the coolant 14 upon contact with the condensing device 13. Notably, the condensing device 13 is located on the inner side wall of the first chamber C1, rather than right above the surface of the coolant 14, which facilitates the routine maintenance when the heat-generating device 12 is to be placed in or taken out from the first chamber C1 without being blocked by the condensing device 13.

According to this embodiment, the heat-generating device 12 is a server, and the condensing device 13 is a condenser coil. When the coolant 14 absorbs the dissipating heat from the server 12 during operation and reaches a boiling point temperature generating the coolant vapor, the coolant vapor rises from the surface level of the coolant 14 and then is condensed, upon contact with or exposed to the condenser coil 13, into a cooling liquid which falls back in the first chamber C1 due to relative density and operation of gravity, thereby completing the vaporization-condensation cycle.

It is understood that the number of the condenser coil 13 is not limited to one. Depending on the actual number of servers 12 placed in the first chamber C1, a plurality of the condenser coils 13 are provided and located on the inner side wall of the first chamber C1. In addition, the coolant 14 is a non-conductive coolant, which is known to ordinary people skilled in the art to which the present invention pertains. Using the non-conductive coolant to cool servers can simplify the sealing structure of a cooling apparatus, and can also prevent the malfunction of servers. In a preferred embodiment, the non-conductive coolant is fluoride, which has a boiling point temperature ranging between 30° C. and 60° C. With such a low boiling point, fluoride can absorb the heat dissipated from servers and the reach to its boiling point temperature, resulting in vaporization of a portion of fluoride. Condenser coils can condense the vapor-phase of fluoride, which can be returned to the chamber. Besides, all non-conductive coolants with a boiling points temperature ranging between 30° C. and 60° C. can be used as the coolants in the present invention.

In fact, it is noteworthy that when many servers keep in operation at the same time for a long period, a great deal of heat will be continuously generated. The condenser coils can't always completely condense all the coolant vapor into coolant liquid due to insufficient cooling capacity. If the coolant vapor cannot be condensed in time, the pressure in the chamber will gradually rise, concomitantly resulting in rise in both the boiling point of the coolant and the internal temperature of the liquid immersion cooling apparatus. In an attempt to deal with this problem, the three-chambered immersion cooling apparatus is provided for effectively relieving the rising pressure caused by the uncondensed coolant vapor by means of pre-adjusting the pressure in the first chamber where the server is placed to less than external atmospheric pressure, Therefore, the three-chambered immersion cooling apparatus can be maintained at a constant pressure during operation of servers.

Figure 2A:
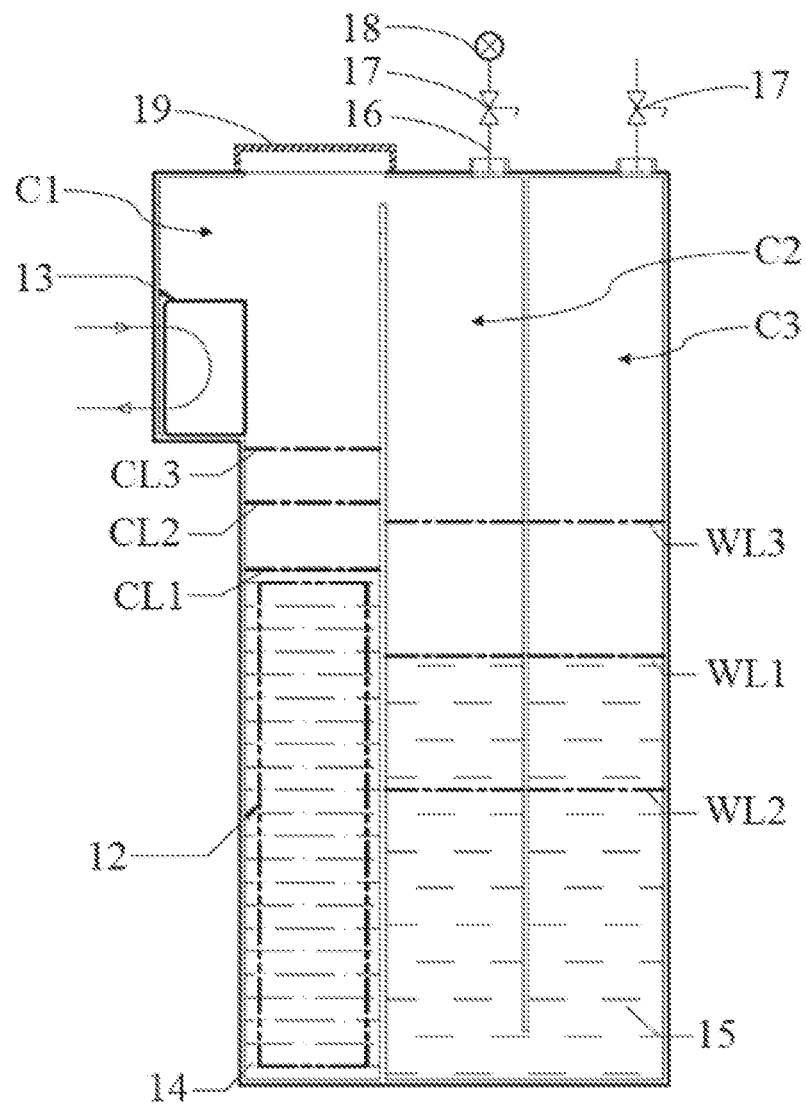
FIG. 2A is a schematic diagram illustrating an initial state of use of the example apparatus of FIG. 1, according to one or more embodiments.

Described below is the rationale for maintaining the three-chambered immersion cooling apparatus at a constant pressure: with reference now to FIG. 2A, there is presented a schematic diagram of an initial state of use of the example immersion cooling apparatus. As shown in FIG. 2A, the first chamber C1, the second chamber C2, and the third chamber C3 are separated from one another by the partitions 110. The first chamber C1 communicates with the second chamber C2 in an interior top area of the housing 11, and the second chamber C2 communicates with the third chamber C3 in an interior bottom area of the housing 11. Prior to using the immersion cooling apparatus, firstly fill the first chamber C1 with the coolant 14 and then place the server 12 in the first chamber C1, ensuring that the server 12 is completely submerged within the coolant 14. The surface level of the coolant 14 maintained in the first chamber C1 is indicated as a first working level CL1. Secondly fill the second chamber C2 and the third chamber C3 with the isolating liquid 15. In this embodiment, the isolating liquid 15 is glycerol. Since the second chamber C2 and the third chamber C3 communicate with each other, the surface level of the isolating liquid 15 maintained in the second chamber C2 is as high as that of the isolating liquid 15 maintained in the third chamber C3, which is indicated as a first adjustment level WL1.

Figure 2B:
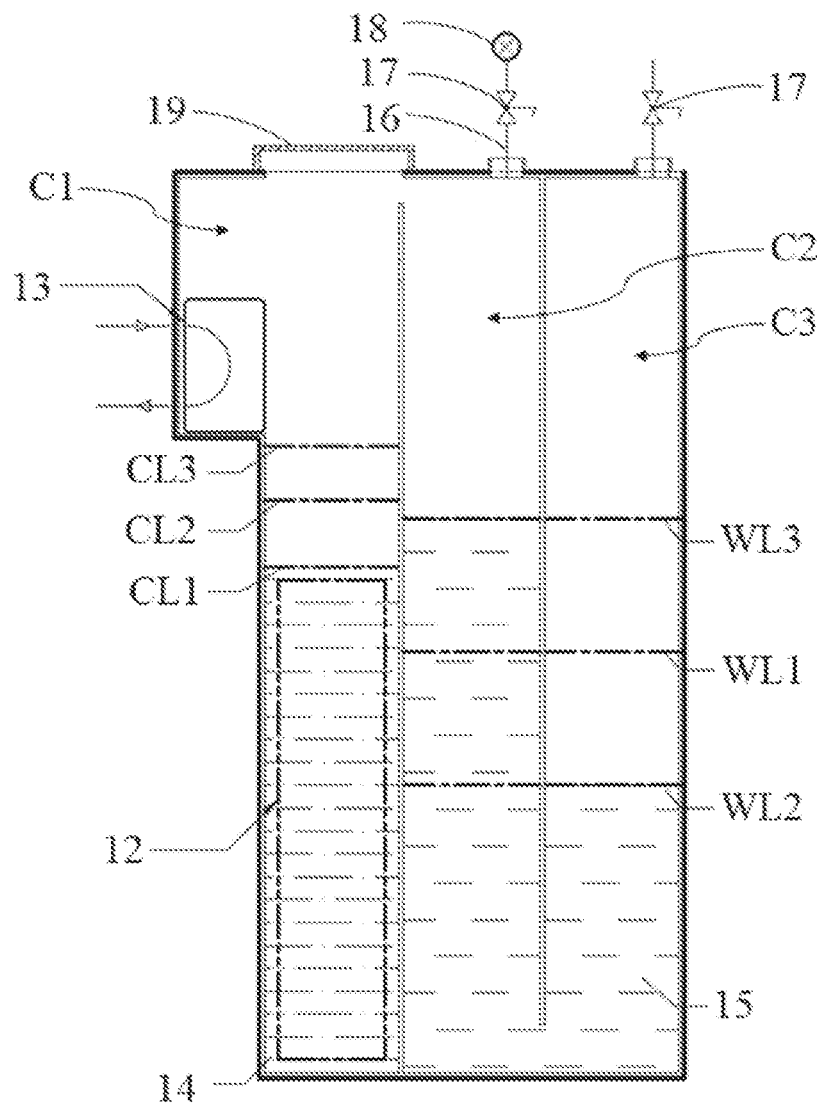
FIG. 2B is a schematic diagram illustrating a state of use of the example apparatus of FIG. 1, after adjusting the air pressure of the chamber where a server is located to less than external atmospheric pressure, according to one or more embodiments.

Next, adjust the pressure in the first chamber C1 and the second chamber C2 before the server 12 is set to operate. As shown in FIG. 2B, there is presented a schematic diagram of a state of use of the example immersion cooling apparatus, after adjusting the air pressure of the chamber where a server is placed to less than external atmospheric pressure. Since the first chamber C1 and the second chamber C2 communicate with each other in an interior top area of the housing 11, the air pressure above the surface of the coolant 14 in the first chamber C1 is the same as that above the surface of the isolating liquid 15 in the second chamber C2. The air pressure above the surface of the isolating liquid 15 in the third chamber C3 is the same as external atmospheric pressure. According to one or more embodiments, the second chamber C2 communicates with the conduit 16, which is connected to the air pump 18 and is provided with the valve 17. A portion of the air in both the first chamber C1 and the second chamber C2 is evacuated through the conduit 16 by the air pump 18, and then the valve 17 is closed to prevent the external air from flowing back into the chamber. By doing so, the air pressure in both the first chamber C1 and the second chamber C2 is less than external atmospheric pressure, and the air pressure in the third chamber C3 is the same as external atmospheric pressure. Therefore, the air pressure in the third chamber C3 is relatively higher than the second chamber C2, which causes the isolating liquid 15 in the third chamber C3 to fall from the first adjustment level WL1 to a second adjustment level WL2, and causes the isolating liquid 15 in the second chamber C2 to rise from the first adjustment level WL1 to a third adjustment level WL3.

Figure 2C:
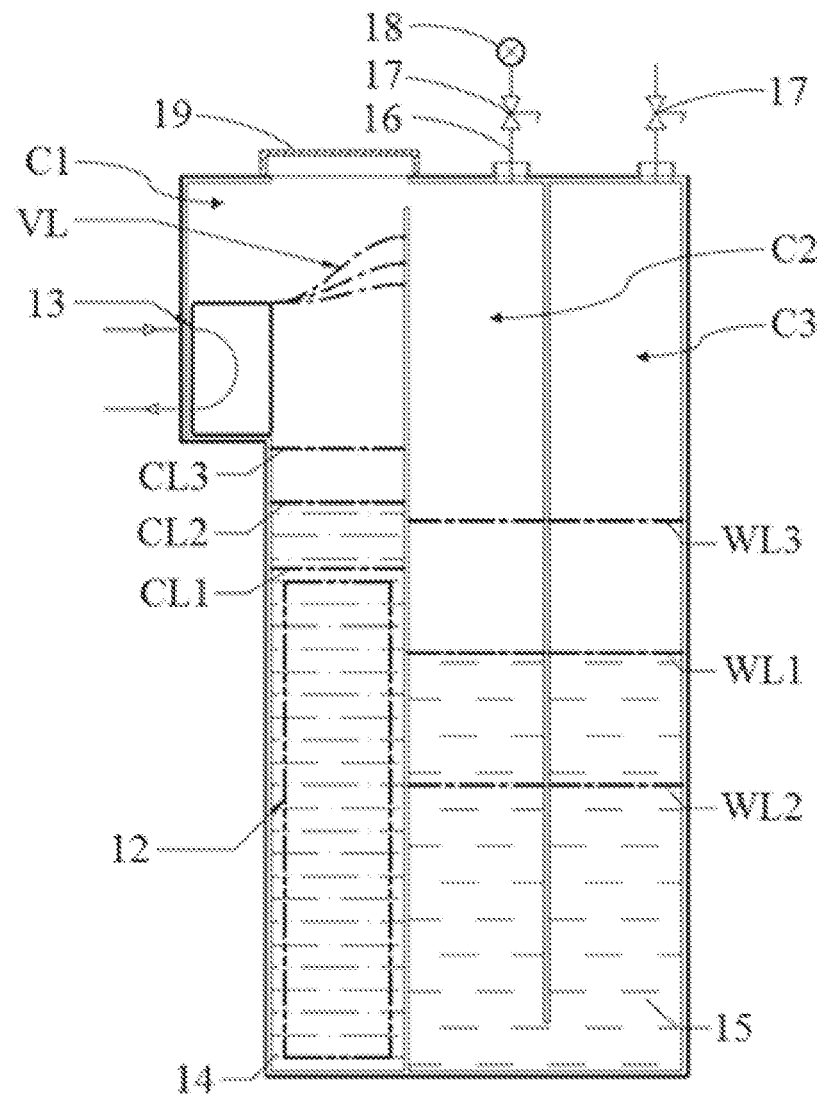
FIG. 2C is a schematic diagram illustrating a state of use of the example apparatus of FIG. 1, when the rising pressure caused by uncondensed coolant vapor in the chamber is relieved, according to one or more embodiments.

Turning now to FIG. 2C, there is presented a schematic diagram of a state of use of the example immersion cooling apparatus, when the rising pressure caused by uncondensed coolant vapor in the chamber is relieved. When the servers 12 start to operate, a lot of heat will be generated. The coolant 14 absorbs the heat dissipated from the servers 12 and then boils at the boiling point temperature generating boiling bubbles. The boiling bubbles expand the volume of the coolant 14, making the surface level of the coolant 14 to rise from the first working level CL1 to either a second working level CL2 or a third working level CL3. When the coolant 14 is vaporized into the coolant vapor VL, the coolant vapor VL rises from the surface level of the coolant 14 and then is condensed, upon contact with or exposed to the condenser coil 13, into a cooling liquid which falls back in the first chamber C1 due to relative density and operation of gravity. However, in most cases where a great deal of heat is continuously dissipated from more than one server, the condenser coil 13 can't always completely condense the coolant vapor VL in time due to insufficient cooling capacity. The uncondensed coolant vapor will eventually cause the pressure in both the first chamber C1 and the second chamber C2 to gradually rise. As mentioned above, based on one or more embodiments, the pressure in the first chamber C1 where the servers 12 are placed has been previously adjusted to less than external atmospheric pressure before the servers 12 start to operate. By doing so, the rising pressure caused by the uncondensed coolant vapor can be effectively relieved in time to reach an equilibrium state in which the isolating liquid 15 in the second chamber C2 falls from the third adjustment level WL3 back to the first adjustment level WL1, and meanwhile the isolating liquid 15 in the third chamber C3 rises from the second adjustment level WL2 back to the first adjustment level WL1, being maintained at a constant pressure.

Example 2

Figure 3:
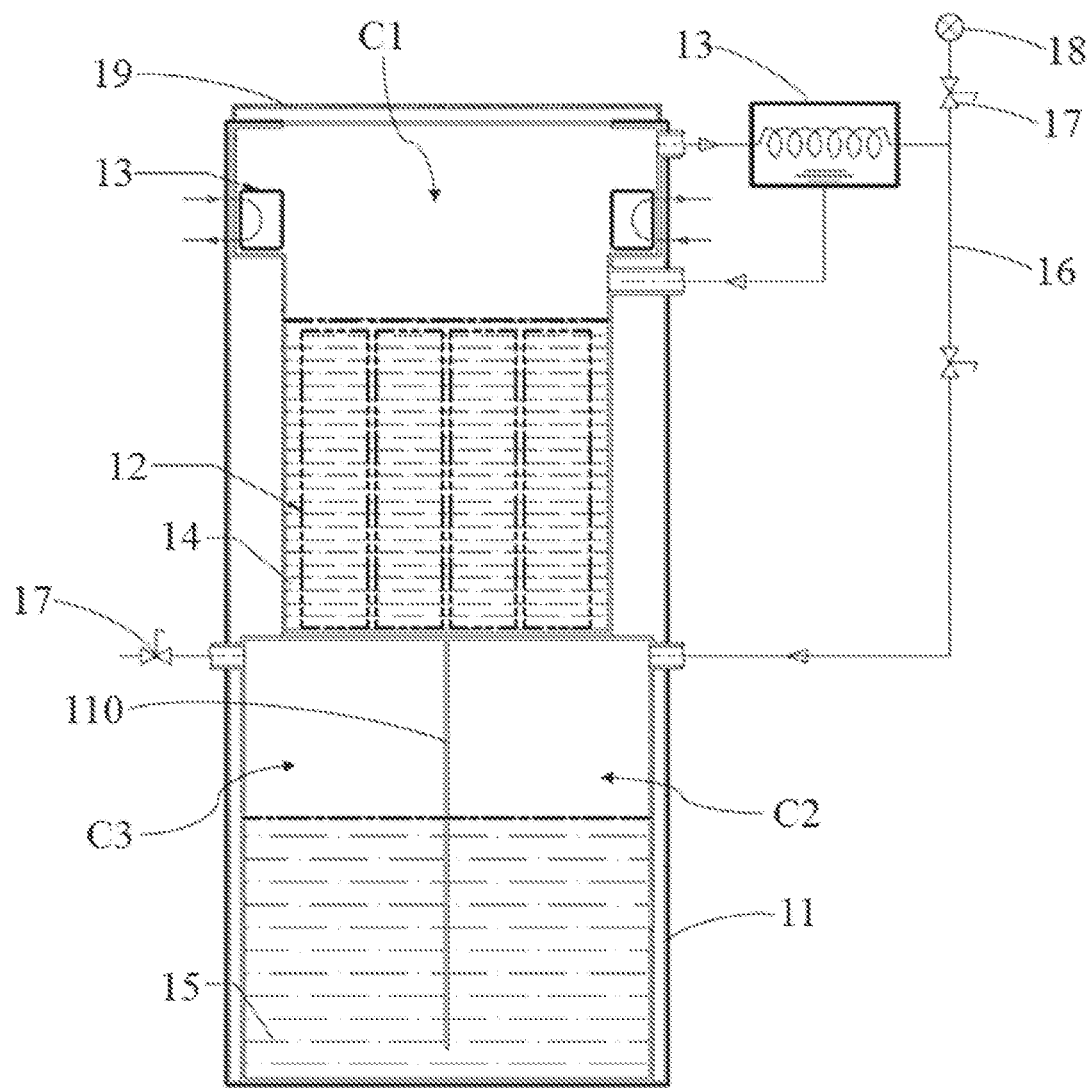
FIG. 3 is a schematic diagram of another example of a three-chambered constant pressure apparatus for liquid immersion cooling of servers, according to one or more embodiments.

Turning now to FIG. 3, FIG. 3 illustrates a schematic diagram of another example three-chambered constant pressure apparatus for liquid immersion cooling of servers. According to one embodiment, provided is a three-chambered constant pressure immersion cooling apparatus, which comprises a housing 11 that has three separate chambers C1, C2, C3, a coolant 14 maintained within chamber(s), a isolating liquid 15 maintained within chamber(s), at least one heat-generating device 12, and at least one condensing device 13.

The housing 11 is provided with three chambers, a first chamber C1, a second chamber C2 and a third chamber C3 respectively. The second chamber C2 is separated from the third chamber C3 by a partition 110. The second chamber C2 communicates with the third chamber C3 in an interior bottom area of the housing 11. The first chamber C1 is disposed on the top of both the second chamber C2 and the third chamber C3. The first chamber C1 communicates with the second chamber C2 via a conduit 16. A coolant 14 is maintained within the first chamber C1, and an isolating liquid 15 is maintained within the second chamber C2 and the third chamber C3. A top lid 19 is mounted on the top of the first chamber C1. Specifically, one end of the conduit 16 communicates with an air area above the surface level of the coolant 14 maintained within the first chamber C1, and the other end of the conduit 16 communicates with an air area above the surface level of the isolating liquid 15 maintained within the second chamber C2. The conduit 16 is connected to an air pump 18. The conduit 16 is further provided with at least one valve 17, which controls flow of air in and out of both the first chamber C1 and the second chamber C2 through the conduit 16. On the side wall of the third chamber C3 is also disposed a valve 17, which controls flow of air in and out between the third chamber C3 and external ambient environment. Compared to the immersion cooling apparatus disclosed in the Example 1, the way in which the chambers are disposed in the housing 11 of Example 2 is stack-wise, therefore increasing the space utilization of a facility.

In addition to the coolant 14 maintained within the first chamber C1, at least one heat-generating device 12 and at least one condensing device 13 are also disposed in the first chamber C1. The at least one heat-generating device 12 is submerged within the coolant 14. The at least one condensing device 13 is located on the inner side wall of the first chamber C1. Specifically, according to this embodiment, the heat-generating device 12 is completely immersed within the coolant 14; that is, the heat-generating device 12 always remains completely immersed within the coolant 14 during the process in which the coolant 14 is vaporized into a coolant vapor by absorbing heat generated by the heat-generating device 12 and the coolant vapor is condensed back into the coolant 14 upon contact with the condensing device 13. Notably, the condensing device 13 is located on each of the two inner side walls of the first chamber C1, rather than right above the surface of the coolant 14, which facilitates the routine maintenance when the heat-generating device 12 is to be placed in or taken out from the first chamber C1 without being blocked by the condensing device 13.

According to this embodiment, the heat-generating device 12 is a server, and the condensing device 13 is a condenser coil. When the coolant 14 absorbs the dissipating heat from the server 12 during operation and reaches a boiling point temperature generating the coolant vapor, the coolant vapor rises from the surface level of the coolant 14 and then is condensed, upon contact with or exposed to the condenser coil 13, into a cooling liquid which falls back in the first chamber C1 due to relative density and operation of gravity, thereby completing the vaporization-condensation cycle.

It is understood that the number of the condenser coil 13 is not limited to two. Depending on the actual number of servers 12 placed in the first chamber C1, a plurality of the condenser coils 13 are provided and located on the inner side wall of the first chamber C1. In addition, the conduit 16 is further provided with the condenser coil 13 for the purpose of enhancing the cooling capacity. In case the condenser coils 13 disposed in the first chamber C1 are unable to condense all the coolant vapor, the uncondensed coolant vapor escaping into the conduit 16 will be condensed, by the condenser coil 13 located on the conduit 16, to a liquid phase of the coolant 14, which can be returned to the first chamber C1 through the conduit 16. The coolant 14 is a non-conductive coolant, which is known to ordinary people skilled in the art to which the present invention pertains. Using the non-conductive coolant to cool servers can simplify the sealing structure of a cooling apparatus, and can also prevent the malfunction of servers. In a preferred embodiment, the non-conductive coolant is fluoride, which has a boiling point temperature ranging between 30° C. and 60° C. With such a low boiling point, fluoride can absorb the heat dissipated from servers and the reach to its boiling point temperature, resulting in vaporization of a portion of fluoride. Condenser coils can condense the vapor-phase of fluoride, which can be returned to the chamber. Besides, all non-conductive coolants with a boiling points temperature ranging between 30° C. and 60° C. can be used as the coolants in the present invention.

In fact, it is noteworthy that when many servers keep in operation at the same time for a long period, a great deal of heat will be continuously generated. The condenser coils can't always completely condense all the coolant vapor into coolant liquid due to insufficient cooling capacity. If the coolant vapor cannot be condensed in time, the pressure in the chamber will gradually rise, concomitantly resulting in rise in both the boiling point of the coolant and the internal temperature of the liquid immersion cooling apparatus. In an attempt to deal with this problem, the three-chambered immersion cooling apparatus is provided for effectively relieving the rising pressure caused by the uncondensed coolant vapor by means of pre-adjusting the pressure in the first chamber where the server is placed to less than external atmospheric pressure, Therefore, the three-chambered immersion cooling apparatus can be maintained at a constant pressure during operation of servers.

Figure 4A:
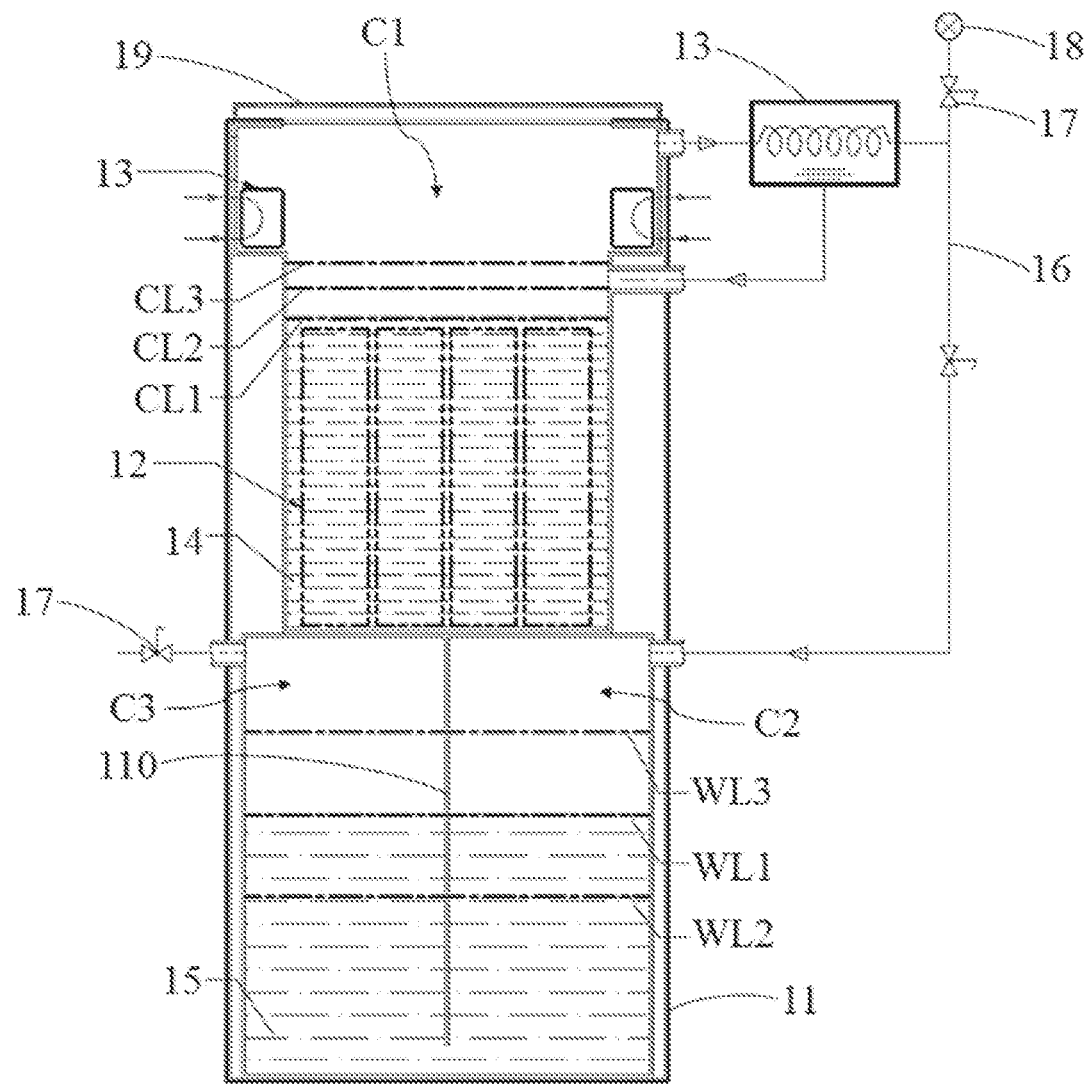
FIG. 4A is a schematic diagram illustrating an initial state of use of the example apparatus of FIG. 3, according to one or more embodiments.

Described below is the rationale for maintaining the three-chambered immersion cooling apparatus at a constant pressure: with reference now to FIG. 4A, there is presented a schematic diagram of an initial state of use of another example immersion cooling apparatus. As shown in FIG. 4A, the second chamber C2 is separated from the third chamber C3 by a partition 110. The second chamber C2 communicates with the third chamber C3 in an interior bottom area of the housing 11. The first chamber C1 is disposed on the top of both the second chamber C2 and the third chamber C3. The first chamber C1 communicates with the second chamber C2 via the conduit 16. Prior to using the immersion cooling apparatus, firstly fill the first chamber C1 with the coolant 14 and then place the server 12 in the first chamber C1, ensuring that the server 12 is completely submerged within the coolant 14. The surface level of the coolant 14 maintained in the first chamber C1 is indicated as a first working level CL1. Secondly fill the second chamber C2 and the third chamber C3 with the isolating liquid 15. In this embodiment, the isolating liquid 15 is glycerol. Since the second chamber C2 and the third chamber C3 communicate with each other, the surface level of the isolating liquid 15 maintained in the second chamber C2 is as high as that of the isolating liquid 15 maintained in the third chamber C3, which is indicated as a first adjustment level WL1.

Figure 4B:
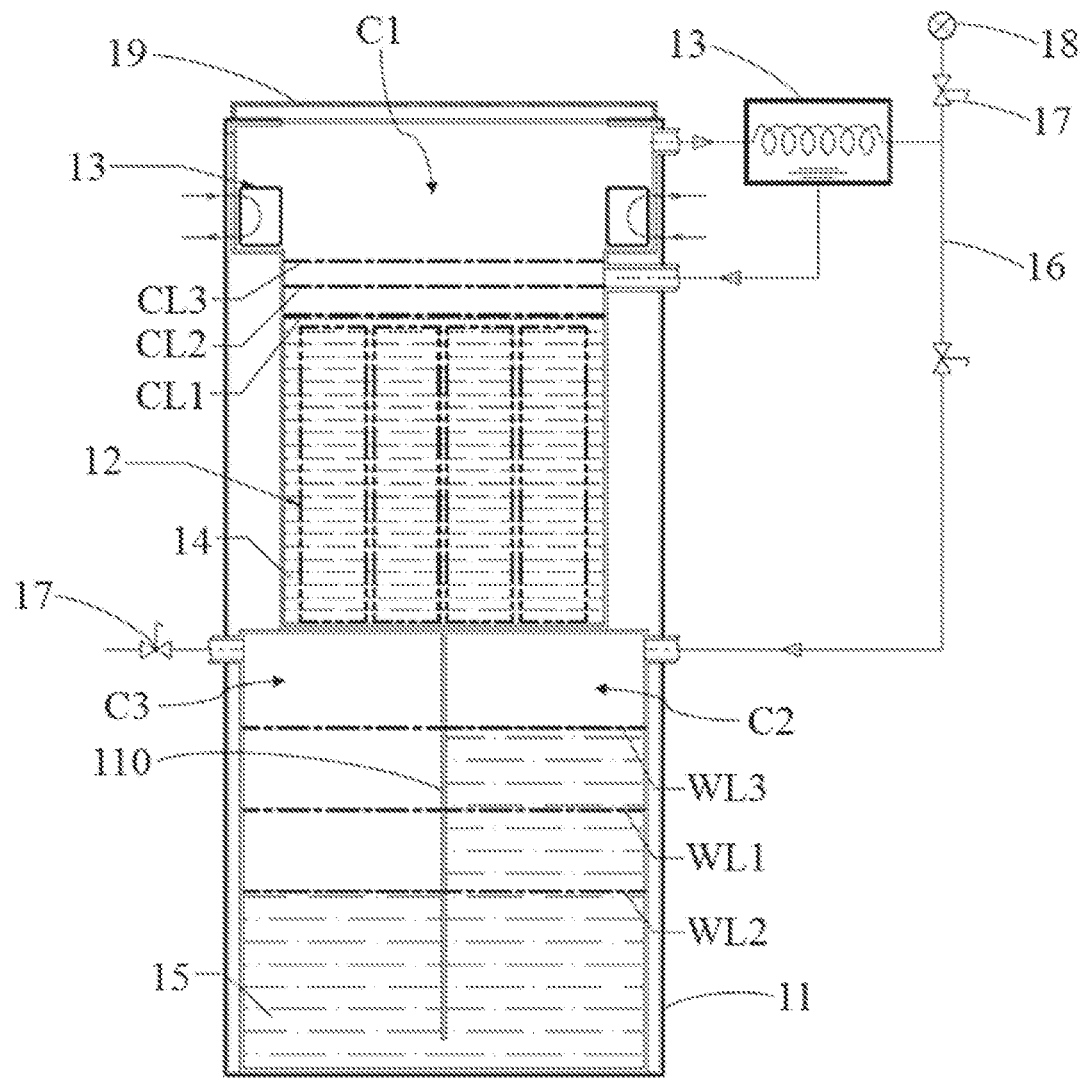
FIG. 4B is a schematic diagram illustrating a state of use of the example apparatus of FIG. 3, after adjusting the air pressure of the chamber where a server is located to less than external atmospheric pressure, according to one or more embodiments.

Next, adjust the pressure in the first chamber C1 and the second chamber C2 before the server 12 is set to operate. As shown in FIG. 4B, there is presented a schematic diagram of a state of use of another example immersion cooling apparatus, after adjusting the air pressure of the chamber where a server is placed to less than external atmospheric pressure. Since the first chamber C1 communicates with the second chamber C2 via the conduit 16, the air pressure above the surface of the coolant 14 in the first chamber C1 is the same as that above the surface of the isolating liquid 15 in the second chamber C2. The air pressure above the surface of the isolating liquid 15 in the third chamber C3 is the same as external atmospheric pressure. According to one or more embodiments, one end of the conduit 16 communicates with an air area above the surface level of the coolant 14 maintained within the first chamber C1, and the other end of the conduit 16 communicates with an air area above the surface level of the isolating liquid 15 maintained within the second chamber C2. The conduit 16 is connected to the air pump 18, and is further provided with at least one valve 17, which controls flow of air in and out of both the first chamber C1 and the second chamber C2 through the conduit 16. A portion of the air in both the first chamber C1 and the second chamber C2 is evacuated through the conduit 16 by the air pump 18, and then the valve 17 is closed to prevent the external air from flowing back into the chamber. By doing so, the air pressure in both the first chamber C1 and the second chamber C2 is less than external atmospheric pressure, and the air pressure in the third chamber C3 is the same as external atmospheric pressure. Therefore, the air pressure in the third chamber C3 is relatively higher than the second chamber C2, which causes the isolating liquid 15 in the third chamber C3 to fall from the first adjustment level WL1 to a second adjustment level WL2, and causes the isolating liquid 15 in the second chamber C2 to rise from the first adjustment level WL1 to a third adjustment level WL3.

Figure 4C:
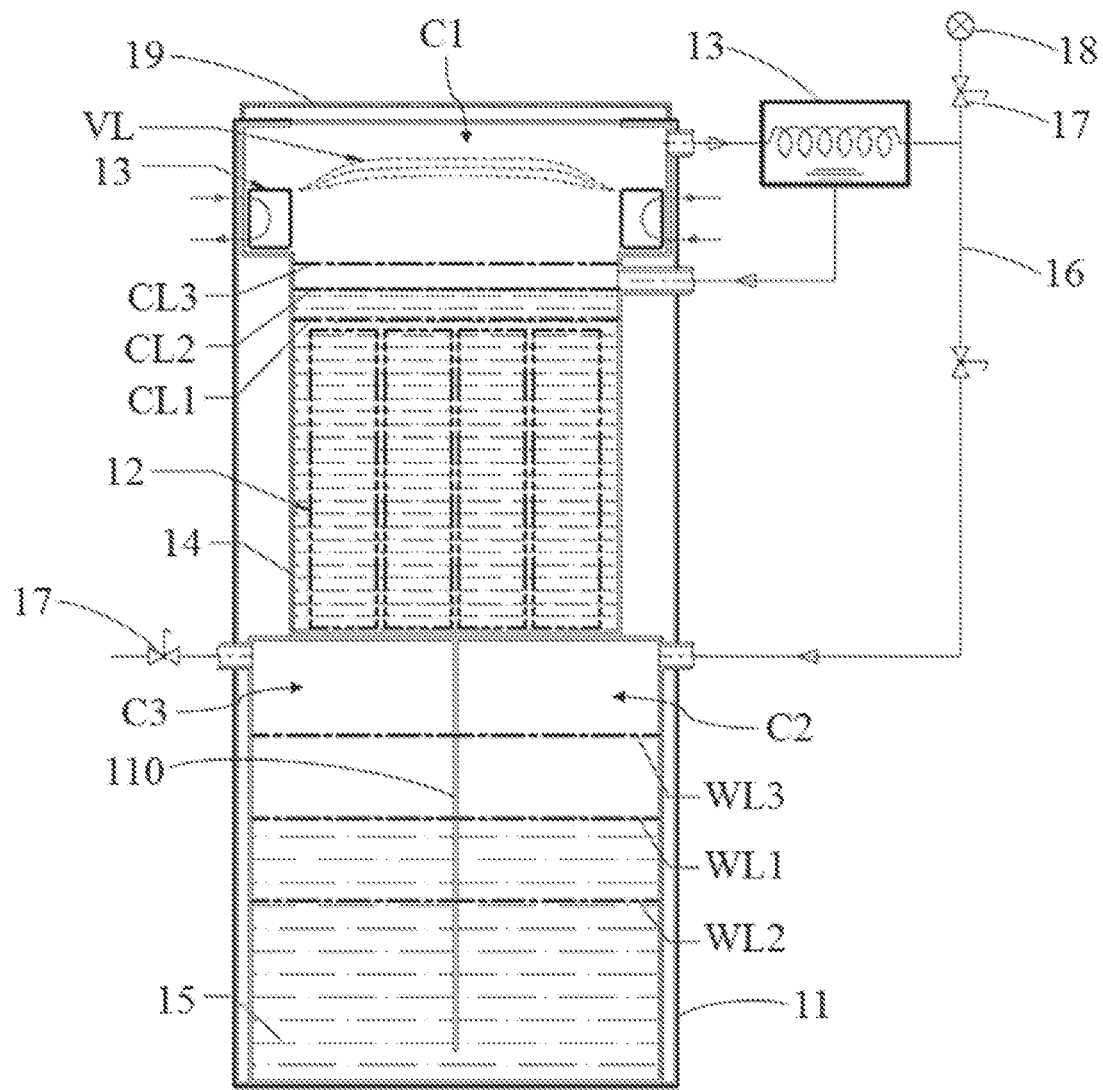
FIG. 4C is a schematic diagram illustrating a state of use of the example apparatus of FIG. 3, when the rising pressure caused by uncondensed coolant vapor in the chamber is relieved, according to one or more embodiments.

Turning now to FIG. 4C, there is presented a schematic diagram of a state of use of the example immersion cooling apparatus, when the rising pressure caused by uncondensed coolant vapor in the chamber is relieved. When the servers 12 start to operate, a lot of heat will be generated. The coolant 14 absorbs the heat dissipated from the servers 12 and then boils at the boiling point temperature generating boiling bubbles. The boiling bubbles expand the volume of the coolant 14, making the surface level of the coolant 14 to rise from the first working level CL1 to either a second working level CL2 or a third working level CL3. When the coolant 14 is vaporized into the coolant vapor VL, the coolant vapor VL rises from the surface level of the coolant 14 and then is condensed, upon contact with or exposed to the condenser coil 13, into a cooling liquid which falls back in the first chamber C1 due to relative density and operation of gravity. However, in most cases where a great deal of heat is continuously dissipated from more than one server, the condenser coil 13 can't always completely condense the coolant vapor VL in time due to insufficient cooling capacity. The uncondensed coolant vapor will eventually cause the pressure in both the first chamber C1 and the second chamber C2 to gradually rise. As mentioned above, based on one or more embodiments, the pressure in the first chamber C1 where the servers 12 are placed has been previously adjusted to less than external atmospheric pressure before the servers 12 start to operate. By doing so, the rising pressure caused by the uncondensed coolant vapor can be effectively relieved in time to reach an equilibrium state in which the isolating liquid 15 in the second chamber C2 falls from the third adjustment level WL3 back to the first adjustment level WL1, and meanwhile the isolating liquid 15 in the third chamber C3 rises from the second adjustment level WL2 back to the first adjustment level WL1, being maintained at a constant pressure.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. A three-chambered constant pressure apparatus for liquid immersion cooling of servers, comprising:
    a housing within which two partitions are disposed, height of each of the partitions being smaller than that of the housing, the two partitions dividing the housing into a first chamber, a second chamber, and a third chamber, the first chamber communicating with the second chamber in an interior top area of the housing, the second chamber communicating with the third chamber in an interior bottom area of the housing, wherein a coolant is maintained within the first chamber; an isolating liquid is maintained within the second chamber and the third chamber; a conduit connected to an air pump is mounted on the top of the second chamber; a valve is mounted on the top of the third chamber;
    at least one heat-generating device submerged within the coolant maintained within the first chamber; and
    at least one condensing device disposed on an inner side wall of the first chamber.

2. The three-chambered constant pressure apparatus for liquid immersion cooling of servers of claim 1, wherein the heat-generating device is a server.

3. The three-chambered constant pressure apparatus for liquid immersion cooling of servers of claim 1, wherein the condensing device is a condenser coil.

4. The three-chambered constant pressure apparatus for liquid immersion cooling of servers of claim 1, wherein the coolant is a non-conductive coolant.

5. The three-chambered constant pressure apparatus for liquid immersion cooling of servers of claim 1, wherein the coolant has a boiling point temperature ranging from 30° C. to 60° C.

6. The three-chambered constant pressure apparatus for liquid immersion cooling of servers of claim 1, wherein the isolating liquid is glycerol.

\* \* \* \* \*